(12) United States Patent
Warnes (10) Patent No.: US 12,136,809 B2
(45) Date of Patent: Nov. 5, 2024

(54) THREE-OUTPUT DC VOLTAGE SUPPLY WITH BI-STABLE LATCH SHORT-CIRCUIT PROTECTION

(71) Applicant: Murata Manufacturing Co., Ltd., Nagaokakyo (JP)

(72) Inventor: Frank Warnes, Milton Keynes (GB)

(73) Assignee: MURATA MANUFACTURING CO., LTD., Kyoto (JP)

( * ) Notice: Subject to any disclaimer, the term of this patent is extended or adjusted under 35 U.S.C. 154(b) by 308 days.

(21) Appl. No.: 17/939,834

(22) Filed: Sep. 7, 2022

(65) Prior Publication Data

US 2023/0076965 A1    Mar. 9, 2023

(30) Foreign Application Priority Data

Sep. 9, 2021 (GB) ..................................... 2112856

(51) Int. Cl.
*H02H 7/00* (2006.01)
*H02H 7/20* (2006.01)
*H03K 17/687* (2006.01)

(52) U.S. Cl.
CPC ......... *H02H 7/205* (2013.01); *H03K 17/6871* (2013.01)

(58) Field of Classification Search
None
See application file for complete search history.

(56) References Cited

U.S. PATENT DOCUMENTS

| 4,716,304 A | 12/1987 | Fiebig et al. |
| 5,424,937 A * | 6/1995 | Iyotani ............. H03K 17/08144 363/136 |
| 5,825,136 A * | 10/1998 | Rudolph ............ H05B 41/2855 315/307 |

(Continued)

FOREIGN PATENT DOCUMENTS

| WO | 2014/039191 A1 | 3/2014 |
| WO | 2021/120220 A1 | 6/2021 |

(Continued)

OTHER PUBLICATIONS

Official Communication issued in United Kingdom Patent Application No. GB2112856.6, mailed on Mar. 2, 2022.

*Primary Examiner* — Stephen W Jackson
(74) *Attorney, Agent, or Firm* — Keating & Bennett, LLP (57) ABSTRACT

A three-output DC voltage supply for providing a positive, an intermediate, and a negative voltage supply is provided which includes a positive DC voltage bus and a negative DC voltage bus configured to be connected to a DC power source, a first voltage divider connected between the positive DC voltage bus and the negative DC voltage bus, wherein the first voltage divider includes a voltage-setting component and a resistive component, and a short-circuit protection component including first and second transistors of opposite types connected between the voltage-setting component and the resistive component, wherein a base of the first transistor is connected to a collector of the second transistor to define a first base/collector node, a base of the second transistor is connected to a collector of the first transistor to define a second base/collector node, and the intermediate voltage supply is provided by either the first or second gate/collector nodes.

17 Claims, 8 Drawing Sheets

(56) References Cited

U.S. PATENT DOCUMENTS

| | | | | |
|---|---|---|---|---|
| 5,859,757 A | * | 1/1999 | Hanafusa | G05F 1/575 |
| | | | | 361/93.7 |
| 2004/0251883 A1 | * | 12/2004 | Brosh | H02M 1/36 |
| | | | | 323/282 |
| 2022/0103070 A1 | | 3/2022 | Chen et al. | |

FOREIGN PATENT DOCUMENTS

| | | |
|---|---|---|
| WO | 2022/129940 A1 | 6/2022 |
| WO | 2022/129943 A1 | 6/2022 |

\* cited by examiner

THREE-OUTPUT DC VOLTAGE SUPPLY WITH BI-STABLE LATCH SHORT-CIRCUIT PROTECTION

CROSS REFERENCE TO RELATED APPLICATIONS

This application claims the benefit of United Kingdom Patent Application No. 2112856.6 filed on Sep. 9, 2021. The entire contents of this application are hereby incorporated herein by reference.

BACKGROUND OF THE INVENTION

1. Field of the Invention

The application relates to a three-output DC voltage supply with short-circuit protection provided by a bi-stable latch, in particular, to a three-output DC voltage supply for gate driving of transistors.

2. Description of the Related Art

Three-output DC voltage supplies are used with components or circuits which require a positive, intermediate, and negative voltage supply.

One application of such a power supply is driving the gate of transistors, such as insulated gate bipolar transistors (IGBTs), Silicon Carbide (SiC), Gallium Nitride (GaN), and other metal oxide semiconductor field effect transistors (MOSFETs). Transistors such as these require specific positive and negative gate voltages to turn them on or off. In these cases, the power supply will provide a positive (+v), neutral (0 V) and negative (−v) voltage supply, achieved by connecting the intermediate voltage output to a ground reference.

Figure 1:
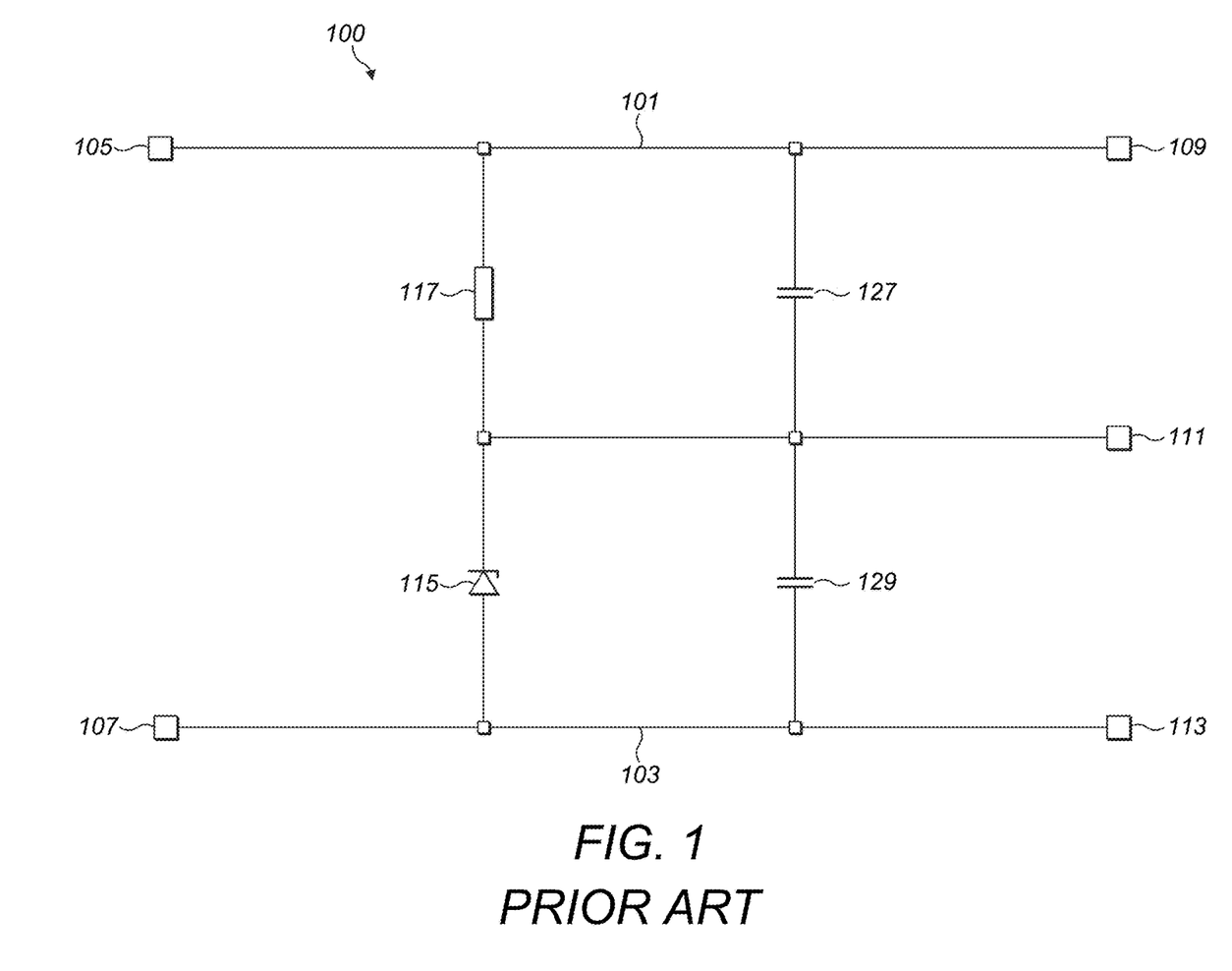
FIG. 1 is an example circuit diagram of a three-output DC voltage supply according to the art.
Figure 2:
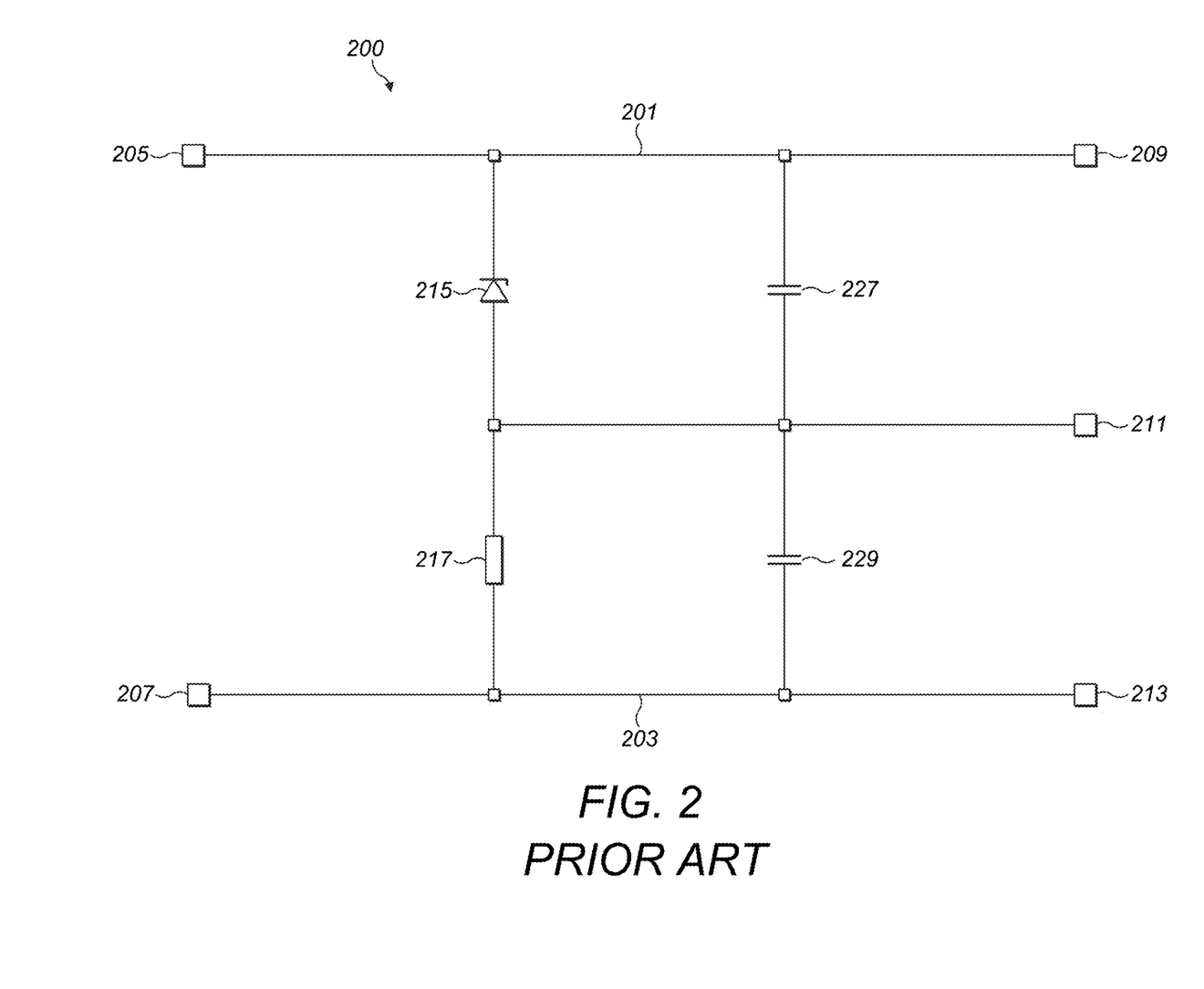
FIG. 2 is a second example circuit diagram of a three-output DC voltage supply according to the art.

Known three-output DC voltage supplies provide a precise voltage drop between the intermediate voltage output terminal and either the positive or negative voltage output terminals, by inserting a Zener diode between the appropriate voltage outputs. The remaining voltage is absorbed by a resistor connected in series with the Zener diode. In this sense, the resistor and the Zener diode provide a voltage divider where the center of the voltage divider provides the intermediate voltage output. FIGS. 1 and 2 provide examples of such three-output DC voltage supplies.

However, if a short circuit occurs across the resistor of the voltage divider, the total voltage will be applied across the Zener diode, and the Zener diode will breakdown, causing a large current to flow. There is no way of limiting the current through the Zener diode. This means that the Zener diode is exposed to an overvoltage and can become damaged. Thus, it would be beneficial to protect the Zener diode, or voltage regulator, in the event of a short circuit.

As will be appreciated from the following detailed description, other means of setting a precise voltage drop between two voltage outputs are also used, and can be protected in the same manner.

SUMMARY OF THE INVENTION

A three-output DC voltage supply according to the present invention provides a positive, an intermediate, and a negative voltage supply is provided which includes a positive DC voltage bus and a negative DC voltage bus configured to be connected to a DC power source, a first voltage divider connected between the positive DC voltage bus and the negative DC voltage bus, wherein the first voltage divider includes a voltage-setting component and a resistive component, and a short-circuit protection component including first and second transistors of opposite types connected between the voltage-setting component and the resistive component, wherein a base of the first transistor is connected to a collector of the second transistor to define a first base/collector node, a base of the second transistor is connected to a collector of the first transistor to define a second base/collector node, and the intermediate voltage supply is provided by either the first or the second base/collector node.

This provides a cheap and low-component short-circuit protection of a three-output DC voltage supply. As the short-circuit protection does not rely on interaction with any of the voltage-setting components, i.e. there is no interplay between the voltage-setting component and the pair of transistors, it can be applied to any manner of voltage-setting circuitry, such as Zener diodes, emitter followers, or shunt regulators. It can also be used to protect high-side or low-side voltage-setting components.

In a further preferred embodiment, the first transistor is a PNP or P-channel transistor, and the second transistor is an NPN or N-channel transistor. These transistors work together to latch either on or off once or the other is biased off. This allows versatility in the arrangement of the transistors and their location in the circuit.

In a further preferred embodiment, the intermediate voltage supply is provided by the first base/collector node.

This allows the voltage-setting or regulating component to be located at the low side of the circuit, which maintains precisely the voltage difference between the intermediate and low voltage outputs.

In an alternative preferred embodiment, the intermediate voltage supply is provided by the second base/collector node.

This allows the voltage-setting or regulating component to be located at the low side of the circuit, which maintains precisely the voltage difference between the high and intermediate voltage outputs.

In a further preferred embodiment, the three-output DC voltage supply further includes a first capacitor connected between the positive voltage supply and the intermediate voltage supply, and a second capacitor connected between the intermediate voltage supply and the negative voltage supply. This allows for the high gate currents which are required by an IGBT to be generated.

In a further preferred embodiment, the voltage-setting component includes a Zener diode. This allows voltage control to the desired level using a single component, which is cheaper and takes up less circuit board space or resources.

In an alternative preferred embodiment, the voltage-setting component includes a third transistor. The transistor allows simple control over the desired voltage with a low diversity of components.

In a further preferred embodiment, the three-output DC voltage supply further includes a pair of voltage-setting resistors connected between the positive DC voltage bus and the negative DC voltage bus to define a potential divider, and wherein the base of the third transistor is connected to the output of the voltage divider. This allows easy control of the desired voltage provided by the third transistor of the preferred embodiment above. By adjusting the value of just one resistor, the setting voltage provided by the transistor can be changed.

In an alternative preferred embodiment, the voltage-setting component includes a shunt regulator. The shunt regulator allows simple control over the desired voltage with a low diversity of components.

In a further preferred embodiment, the three-output DC voltage supply further includes a pair of voltage-setting resistors connected between either the positive DC voltage bus and the emitter of the first transistor or the negative DC voltage bus and the emitter of the second transistor to define a potential divider, and wherein the input of the shunt regulator is connected to the output of the voltage divider. This allows easy control of the desired voltage provided by the shunt regulator of the preferred embodiment above. By adjusting the value of just one resistor, the setting voltage provided by the transistor can be changed.

In a further preferred embodiment, the shunt regulator includes an adjustable reference diode.

In a further preferred embodiment, the resistive component includes a resistor.

In a further preferred embodiment, the first and the second transistors are connected by their respective emitters between the voltage-setting component and the resistive component.

In a further preferred embodiment, the power source is an output from a DC-DC converter.

In an alternative preferred embodiment, the power source is a rectified output from a transformer.

In a further preferred embodiment, the intermediate voltage supply is a 0-V voltage supply.

The above and other elements, features, steps, characteristics and advantages of the present invention will become more apparent from the following detailed description of the preferred embodiments with reference to the attached drawings.

BRIEF DESCRIPTION OF THE DRAWINGS

Preferred embodiments of the invention will now be described, by way of illustration only, and with reference to the drawings, in which.

DETAILED DESCRIPTION OF THE PREFERRED EMBODIMENTS

A first example of a known three-output DC voltage supply is shown in FIG. 1. This figure shows a three-output DC voltage supply 100 without any short-circuit protection, and is helpful to understanding the circuits described and shown with respect to FIGS. 3, 6, 7 and 8.

FIG. 1 shows the three-output DC voltage supply circuit 100 including a positive DC voltage bus 101 and a negative DC voltage bus 103. The buses 101 and 103 include input terminals 105 and 107 respectively at their input ends, and output terminals 109, 111 and 113 respectively at their output ends.

The positive voltage input terminal 105 is configured to be connected to the positive side of a DC power supply (not shown). The negative input voltage terminal 107 is configured to be connected to the negative side of the DC power supply (not shown). It is to be noted that the terminology "positive voltage" and "negative voltage" or the like are relative, such that the positive terminal of the DC voltage supply is positive with respect to the negative terminal of the DC voltage supply, and the negative terminal of the DC voltage supply is negative with respect to the positive terminal of the DC voltage supply.

DC power supplies include standalone power supplies, outputs of DC-DC converters or AC-DC converters, batteries, and any supply which provides a substantially DC voltage supply.

Connected between the positive DC voltage bus 101 and the negative DC voltage bus 103 is a voltage divider which is formed by a Zener diode 115 and a resistor 117. The Zener diode 115 is connected by its anode to the negative DC voltage bus 103 and the resistor is connected to the positive DC voltage bus 101. The output of the voltage divider is formed between the cathode of the Zener diode 115 and the resistor 117.

For the purposes of this description, the term resistor is used to mean a component which provides a resistance which can be specified or set by the user. It is noted that other components than a resistor can provide this function, such as a potentiometer, capacitor, coil, inductor, lamp, heating element, etc. For the purposes of this description, the output of a voltage divider is defined as the divided voltage which is supplied from the point where the components of the voltage divider meet.

The output of the voltage divider provides an intermediate voltage output terminal 111, which provides an intermediate voltage which is negative with respect to the positive output voltage terminal 109 and which is positive with respect to the negative voltage output terminal 113.

The Zener diode 115 is specified so as to provide a set voltage drop between the positive voltage output terminal 109 and the intermediate voltage output terminal 111. The resistor 117 is provided to drop the remaining voltage supplied to the positive voltage input terminal 105 and the negative voltage input terminal 107.

Capacitors 127 and 129 are provided for the case where the circuit is used to power a power transistor (not shown), to provide the necessary gate driving currents. If the circuit is not applied to drive a power transistor, then the capacitors 127 and 129 may be omitted.

The circuit 100 of FIG. 1 is suited to applications where the voltage between the intermediate voltage output terminal 111 and the negative voltage output terminal 113 is critical and must be maintained at a precise defined voltage. The Zener diode 115 will provide the correct voltage across these terminals, 111 and 113, regardless of the input voltage to the voltage input terminals 105 and 107, provided this input voltage to the voltage input terminals 105 and 107 is larger than the voltage required, and so long as the resistor 117 is present to dissipate voltage not passed by the Zener diode 115.

The terms positive, intermediate, and negative are relative. All that is meant by these terms is that: the positive voltage output terminal 109 provides a voltage which is positive with respect to voltages provided by both the intermediate voltage output terminal 111 and the negative voltage output terminal 113. The negative voltage output terminal 113 provides a voltage is negative with respect to voltages provided by both the intermediate voltage output terminal 111 and the positive voltage output terminal 109. The intermediate voltage output terminal 111 provides a voltage which is negative with respect to the voltage provided by the positive voltage output terminal 109 and which is positive with respect to the voltage provided by the negative voltage output terminal 113.

Where it is desired to provide an intermediate voltage which is 0 V, the intermediate voltage output terminal 111 can be connected to ground (not shown).

A second example of a known three-output DC voltage supply is shown in FIG. 2. This figure shows a three-output DC voltage supply 200 without any short-circuit protection, and is helpful for understanding the circuit described and shown with respect to FIG. 4.

The circuit 200 works in an identical manner to the circuit 100, except the Zener diode 215 is connected by its cathode to the positive DC voltage bus 201, and the output of the first voltage divider is formed by the anode of the Zener diode 215 and the resistor 217, which is in turn connected to the negative DC voltage bus 203.

Thus the three-output DC voltage supply 200 of FIG. 2 is particularly suited to applications where the voltage between the positive voltage output terminal 209 and the intermediate voltage output terminal 211 is critical and must be maintained at a precise defined voltage.

A further problem with the circuits of FIGS. 1 and 2 is that if either of the resistors 117 or 217 is bypassed, by a short circuit across the relevant DC voltage terminals, then the full supply voltage is applied across to the Zener diode 115 or 215, which can cause damage to the Zener diode 115 or 215.

The term "short circuit" is used to define a situation in which the load connected to the three-output DC voltage supply approaches 0Ω.

Figure 3:
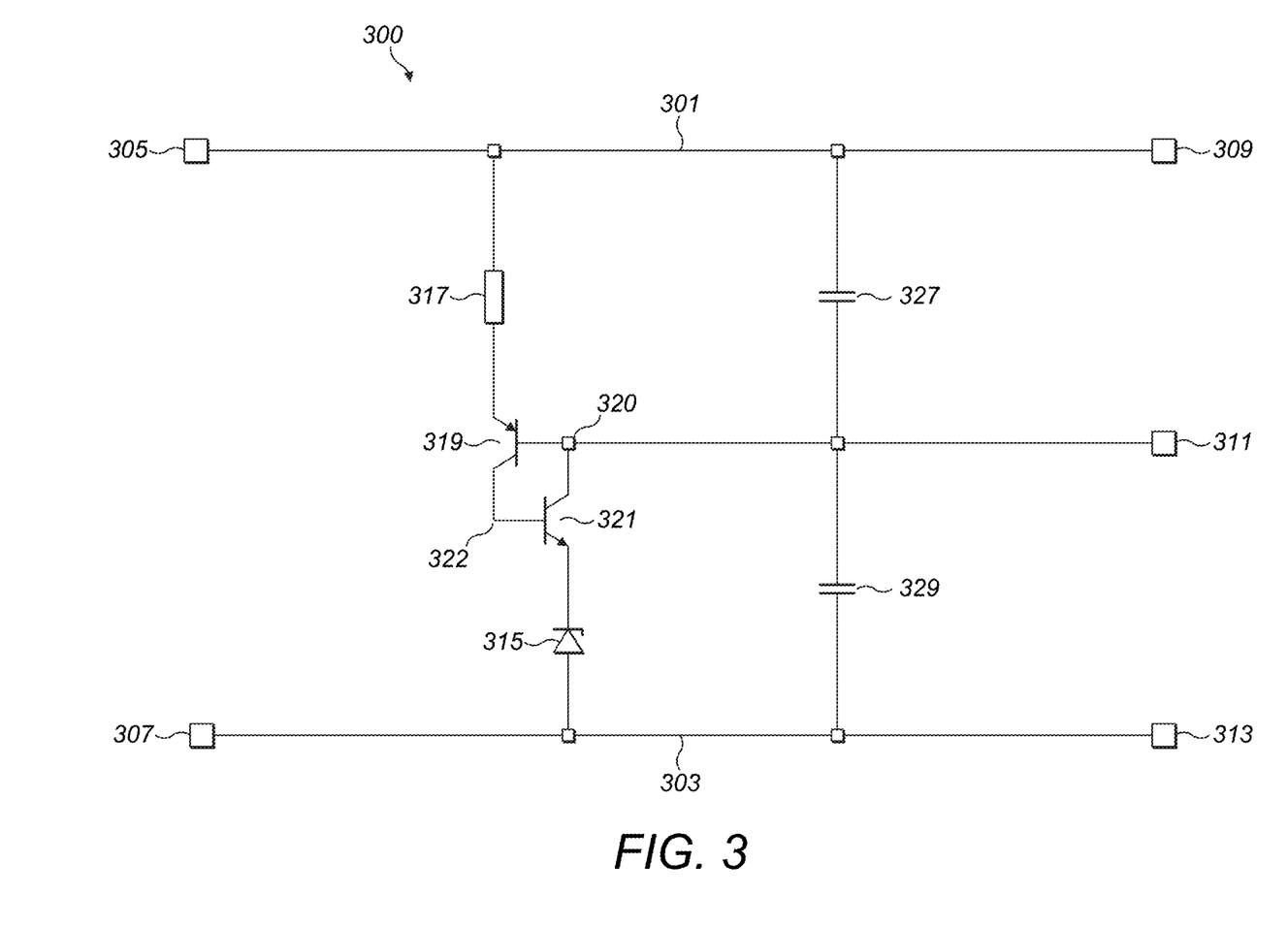
FIG. 3 is a circuit diagram of a three-output DC voltage supply according to first preferred embodiment of the present invention.

A preferred embodiment of a three-output DC voltage supply including short-circuit protection is shown in FIG. 3. The circuit 300 shown in FIG. 3 is an adaptation of the circuit 100 of FIG. 1, with a pair of transistors 319 and 321 arranged to provide short-circuit protection when a short circuit occurs across the positive voltage output terminal 309 and the intermediate voltage output terminal 311.

The circuit 300 includes a resistor 317 connected to the positive DC voltage bus 301 and a Zener diode 315 connected by the anode to the negative DC voltage bus 303; however, between the resistor 317 and the Zener diode 315, first transistor 319 is connected by the emitter to the bottom of the resistor 317, and by the collector to the base of a second transistor 321 to create a second base/collector node 322. In turn, the collector of second transistor 321 is connected to the base of first transistor 319 to create a first base collector node 320, and the emitter of second transistor 321 is connected to the cathode of the Zener diode 315.

The base/collector node 320 between the base of the first transistor 319 and the collector of the second transistor 321 forms the intermediate voltage output terminal 311.

In normal operation the circuit 300 operates in the same way as circuit 100. The operation of the transistors 319 and 321 means that, when a voltage is applied across the input terminals 305 and 307, the Zener diode 315 is able to set the intermediate voltage, and the resistor 317 is able to drop the remaining voltage.

The voltage difference between the positive voltage bus 301 and the intermediate voltage output terminal 311 ensures that the emitter of the first transistor 319 has a higher voltage applied to it than the base, and as such, the transistor 319 is biased on. This causes current to flow from the emitter to the collector of the first transistor 319, which in turn flows to the base of the second transistor 321. As this then has a higher potential than the emitter of the second transistor 321, this transistor 321 is biased on and allows current to flow from the collector to the emitter. This adds to the base current flowing from the first transistor 319, further biasing the first transistor 319 on, increasing the voltage to the second transistor 321 base, further biasing the second transistor 321 on, and so on until both transistors 319 and 321 are saturated. This allows the circuit 300 to operate as the circuit 100 in normal circumstances, as current can flow from the positive DC voltage bus 301 or the intermediate voltage output terminal 311 to the top of the Zener diode 315.

When a short circuit occurs across the resistor 317, however, the transistors 319 and 321 quickly prevent damage to the Zener diode 315 by disconnecting the cathode of the Zener diode 315 from the intermediate voltage output terminal 311.

When a short circuit occurs across the positive voltage output terminal 309 and the intermediate voltage output terminal 311, there is no potential difference between the emitter and the base of the first transistor 319. This therefore biases the first transistor 319 off, which in turn prevents current from flowing from the base of the second transistor 321, biasing the second transistor 321 off. This essentially opens the circuit between the intermediate voltage output terminal 311, which due to the short circuit has the full positive voltage of the positive output voltage terminal 309 applied to it, thereby preventing the Zener diode 315 from being exposed to the high voltage and protecting it.

Figure 4:
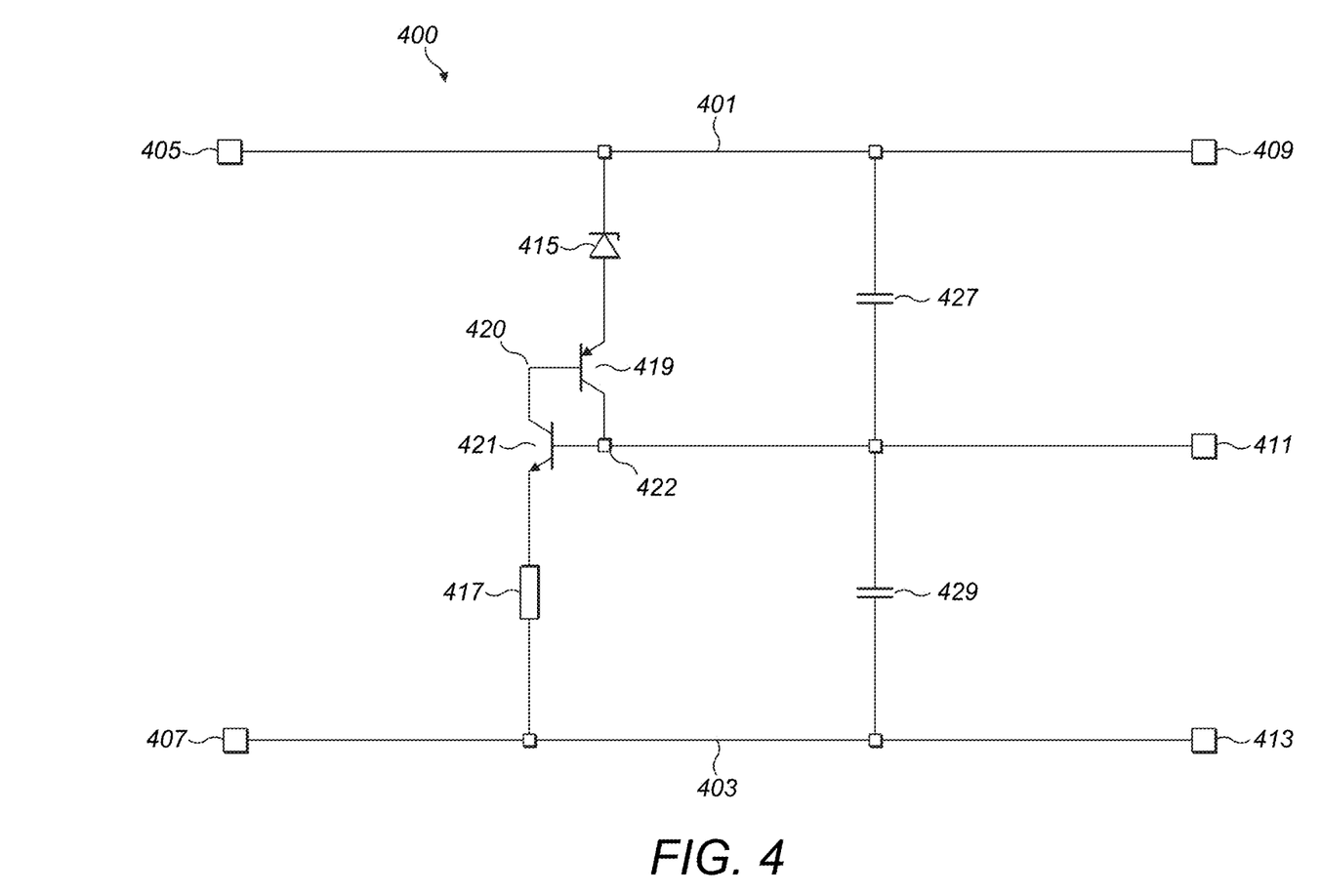
FIG. 4 is a circuit diagram of a three-output DC voltage supply according to a second preferred embodiment of the present invention.

FIG. 4 shows a circuit 400 which is an adapted version of the circuit 200 of FIG. 2, and functionally similar to the circuit 300. In this circuit 400, however, a pair of transistors 419 and 421 protect the Zener diode 415 when a short circuit occurs across the intermediate DC voltage output terminal 411 and the negative voltage output terminal 413. The first transistor 419 is connected by the emitter to the bottom of the resistor 417, and by the collector to the base of the second transistor 421 to create a second base/collector node 422. The second transistor 421 is connected by the emitter to the cathode of the Zener diode 415, and by the collector to the base of the first transistor 419 to create a first base/collector node 420. The collector/base node 422 between the collector of the first transistor 419 and the base of the second transistor 421 forms the intermediate voltage output.

In normal operation, the circuit 400 operates in the same manner as that of circuit 200. The operation of the transistors 419 and 421 means that when a voltage is applied across the input terminals 405 and 407, the Zener diode 415 is able to set the intermediate voltage, and the resistor 417 is able to drop the remaining voltage. As in the example of circuit 300, the higher potential at the first emitter of the first transistor 419 causes the two transistors 419 and 421 to bias each other on.

When a short circuit occurs across the resistor 417, i.e. between the intermediate DC voltage output terminal output 411 and the negative voltage output terminal 413, the base of the second transistor 421 is connected to the negative DC voltage bus 403. As there is no longer a higher base voltage than emitter voltage, the second transistor 421 begins to turn off. This then presents an open circuit at the base of the first transistor 419. As this base is no longer connected to a low voltage source, the first transistor 419 also turns off, and the two transistors 419 and 421 bias each other off. Thus, the Zener diode 415 is protected against short circuits across the resistor 417.

In both circuits 300 and 400, the first transistor 319/419 can be a PNP BJT, and the second transistor 321/421 can be an NPN BJT.

In the example circuits 300 and 400, the input voltage to the circuit is 25 V. The Zener diode voltage is 5 V so the voltage divider provides +20 V and −5 V gate voltages for a power transistor such as a Silicon Carbide transistor. In a standard gate drive application, the voltages are supplied to a gate drive controller which drives peak positive and negative currents into the SiC transistor. The peak currents are supplied by the capacitors 327/427 and 329/429. The DC/DC input voltage supplies an average dc current to top up the two capacitors 327/427 and 329/429, and the divider keeps the two capacitors 327/427 and 329/429 at the specified gate voltages. For some switch types, such as GaN, it is important to have an accurate positive voltage, in which case, the circuit with a Zener diode at the top would be used as shown in FIG. 4; however, for some switch types, such as IGBTs, it is not so important to maintain an accurate positive gate voltage, so a low side Zener diode would be used as in FIG. 3. The value of resistor 317/417 in these example circuits can be 20 kΩ.

Figure 5:
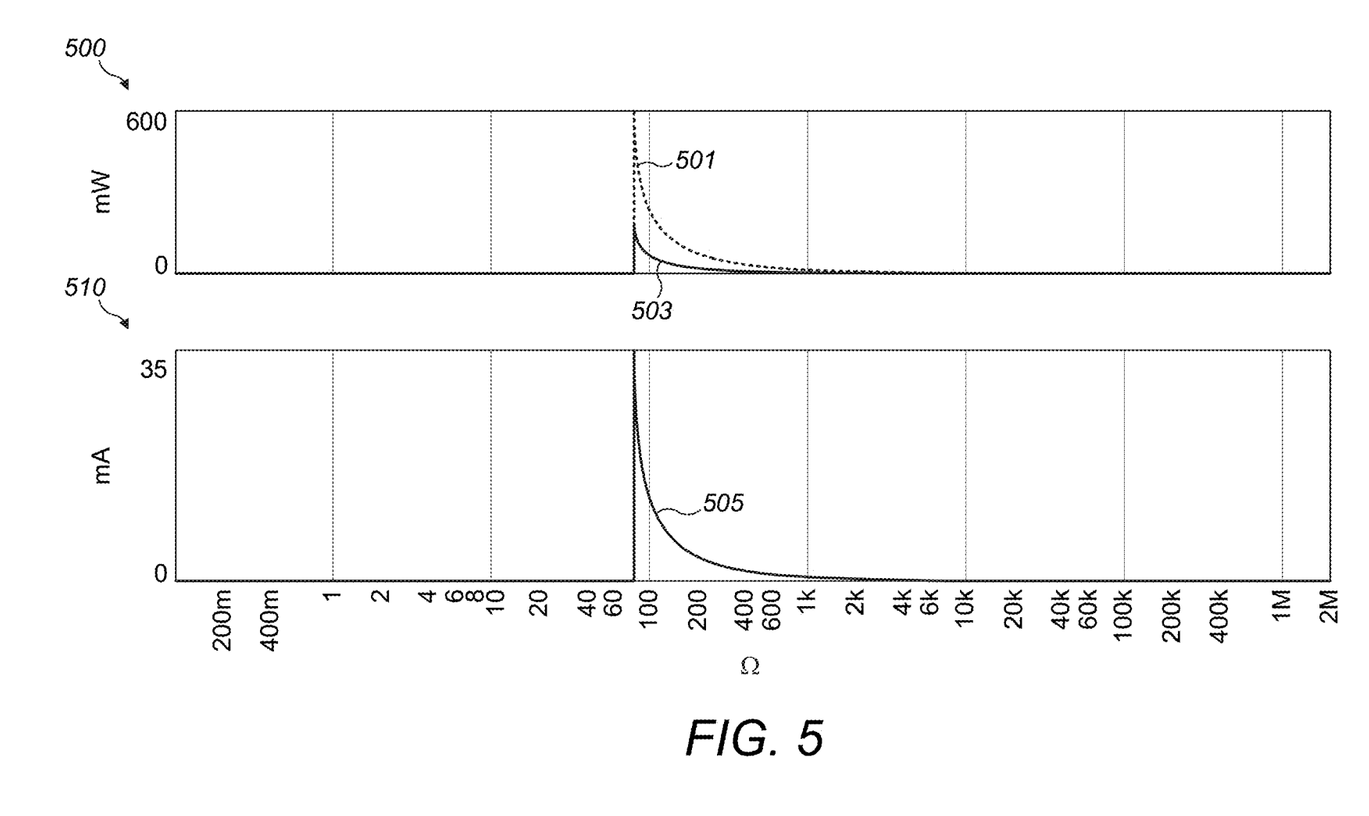
FIG. 5 is an example representation of power and current dissipation through elements of the present invention.

FIG. 5 shows a first graph 500 which plots power dissipated through the second transistor 321 of the circuit 300, as line 501, and through the Zener diode 315, as line 503, against the resistance presented across the positive voltage output terminal 309 and the intermediate voltage output terminal 311. A short circuit across the positive and intermediate voltage output terminals is represented as a diminishing resistance presented at the terminals. This is shown on the x axis of the graph, starting from 0Ω and increasing to 1 MΩ. As the resistance across the terminals 309 and 311 decreases below 1 kΩ the power dissipated through the circuit increases, which if left unprotected, would lead to destruction of the Zener diode 315. As the resistance decreases over this range, the voltage applied to the base of the first transistor 319 increases, as does the collector current of the second transistor 321, and the collector current of the first transistor 319 decreases. This decreases the base current of the second transistor 321. At about 100Ω the power dissipated reaches a peak and then rapidly decreases. This is when the falling current into the base of the second transistor 321 and the rising current into the collector of the second transistor 321 reach the gain shut off point of the second transistor 321.

FIG. 5 also shows a second graph 510 showing the current at the emitter of the second transistor 321. The various currents of the transistors have been explained above, but as can be seen by plot 505, the current begins to increase as the load on the terminals 309 and 311 approaches 0Ω. This current increases up until, along with the falling current into the base of the second transistor 321, the gain shut off point of the second transistor 321 is reached. The x axis of the second graph 510 is the same as the first graph 500, and current is shown on the y axis.

The values used to illustrate these two graphs are merely exemplary, and relate to the specific resistor values and voltage values used in describing the circuit above. Any set of input voltages, output voltages, reference voltages, resistances, and the like can be picked depending on the application. In particular, an example of the voltage outputs of the circuit are +20 V at the positive voltage output terminal 309, 0 V at the intermediate voltage output terminal 311, and −5 V at the negative voltage output terminal 313. The resistor 317 can have a value of 20 kΩ, and with these parameters, the emitter current 505 reaches a peak of 38 mA at a load resistance of 81Ω, and the peak power in the Zener diode 315 reaches 0.2 W, and the transistor 321 peak power reaches 0.63 W. The load resistance value also depends on the gain of the two transistors.

Figure 6:
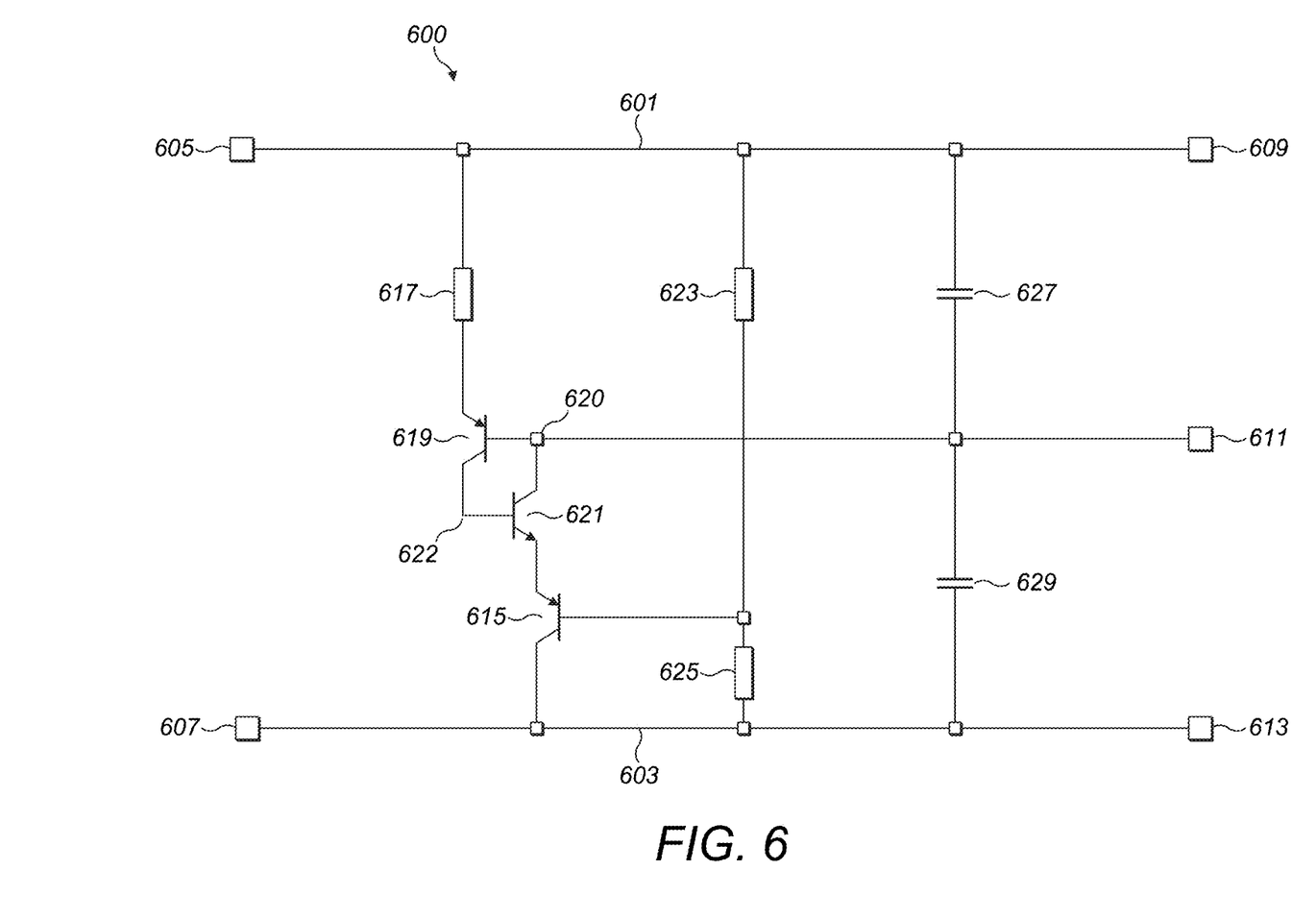
FIG. 6 is a circuit diagram of a three-output DC voltage supply according to a third preferred embodiment of the present invention.

FIG. 6 shows a similar circuit 600 to that of circuit 300, where the voltage-setting component is a transistor 615 which sets a voltage between the intermediate voltage output terminal 611 and the negative voltage output terminal 613. Resistors 623 and 625 are sized to allow the transistor 615 to provide the desired voltage drop between the intermediate voltage output terminal 611 and the negative voltage output terminal 613.

As with the Zener diode example of FIG. 3, the transistor requires protection, and this is achieved in the same manner as in the circuit 300, using the first and second transistors 619 and 621.

Figure 7:
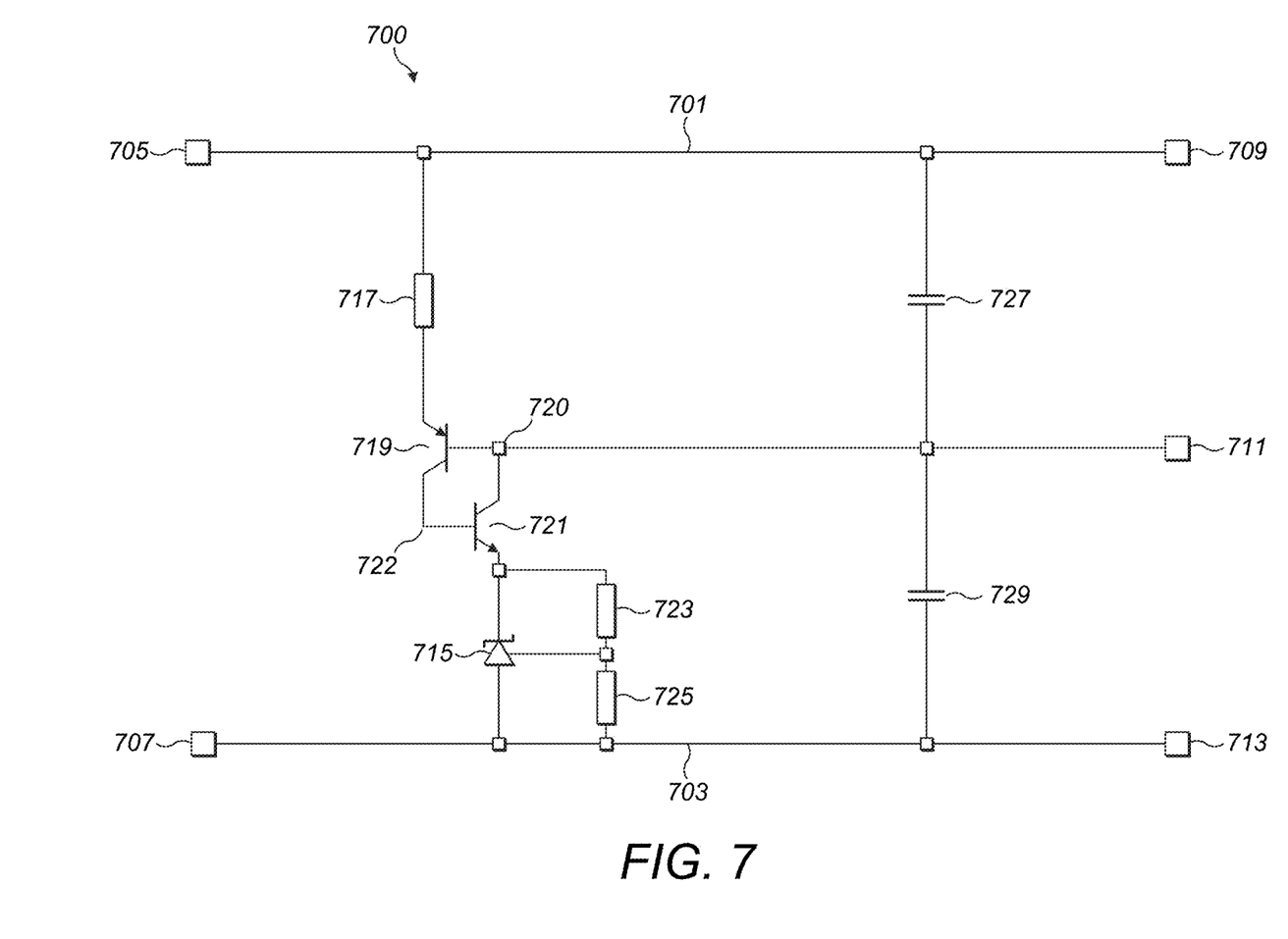
FIG. 7 is a circuit diagram of a three-output DC voltage supply according to a fourth preferred embodiment of the present invention.

FIG. 7 shows a second adaptation to the circuit 300, where the voltage-setting component is a shunt regulator 715, and where resistors 723 and 725 are sized so as to provide the required input voltage to the shunt regulator 715 when the voltage across the resistors 723 and 725 reaches the desired voltage difference between the intermediate voltage output terminal 711 and the negative voltage output terminal 713. The shunt regulator 715 is susceptible to over-voltages when a short circuit occurs across the positive voltage output terminal 709 and the intermediate voltage output terminal 711. Protection is achieved in the same manner as circuit 300 and 600. In normal operation, the transistor 721 is biased on, presenting a short circuit between the intermediate voltage output 711 and the cathode of the shunt regulator 715, the top of the resistor 723 can be connected to the collector of the transistor 721.

Both the circuits 600 and 700 can be inverted so that the desired voltage can be set for the positive and intermediate voltage output terminals 609/709 and 611/711 using the transistor 615 or shunt regulator 715. In the case of the circuit 700, this involves connecting the voltage-setting resistor 721 to the positive DC voltage bus 701, and the voltage-setting resistor 723 to the emitter of the first transistor 719.

Figure 8:
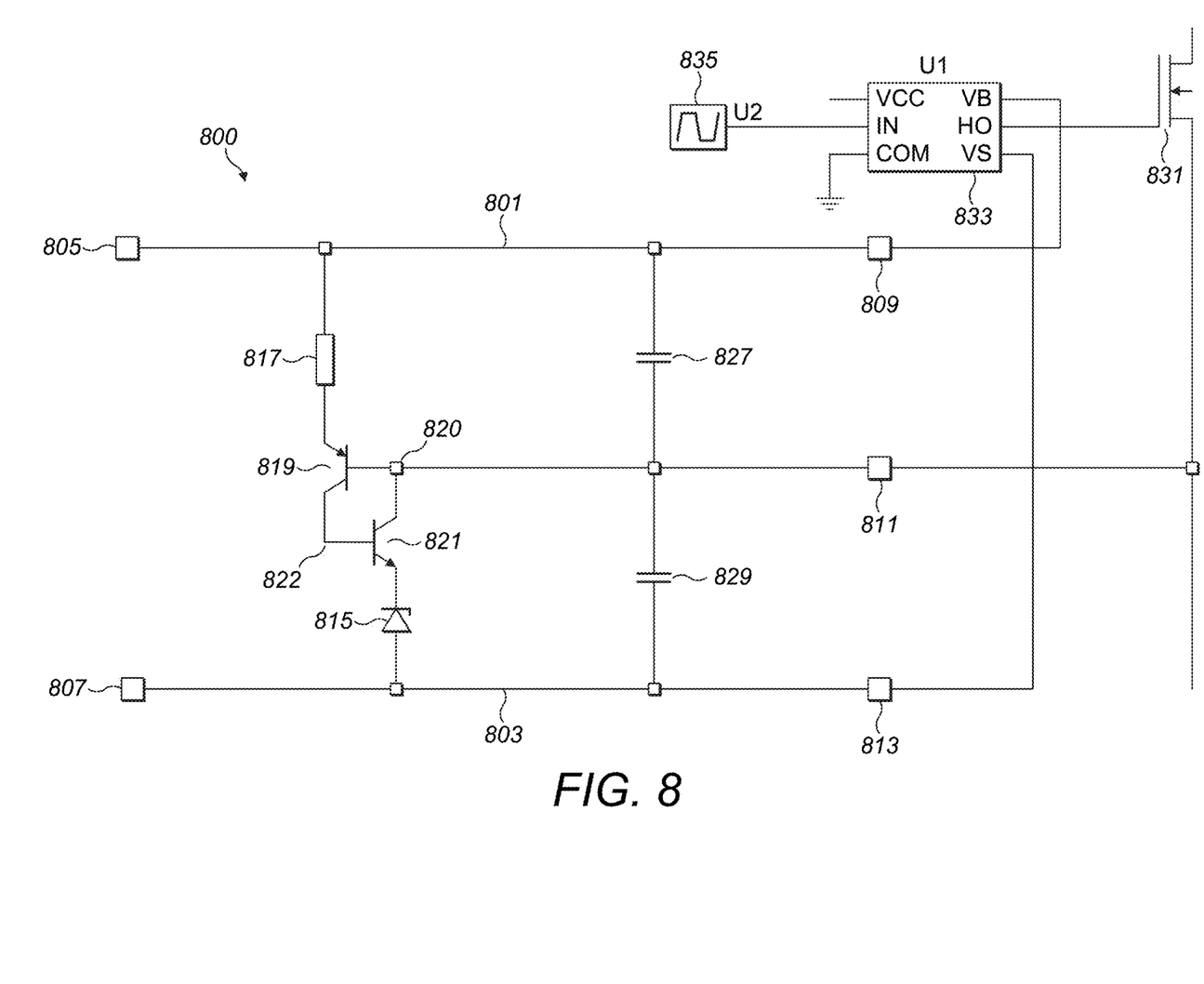
FIG. 8 is a circuit diagram of a three-output DC voltage supply connected to a transistor.

FIG. 8 shows an example implementation circuit 800 of the three-output DC voltage supply shown in FIG. 3. The outputs of the three-output DC voltage supply are connected to a MOSFET or Insulated-Gate Bipolar Transistor (IGBT) 831, with the positive voltage output terminal 809 and the negative voltage output terminal 813 connected to a controller 833. The controller 833 receives a signal input 835, and this signal input 835 is used by the controller 833 to switch either the high voltage input, from the high voltage output terminal 809, or the low voltage input supplied by the low voltage output terminal 813 to the gate of the transistor 831.

The source of the transistor 831 is connected to the intermediate voltage output terminal 811, so that by switching either the high voltage or the low voltage to the gate of the transistor 831, the transistor 831 can be set to block or pass current (Saturated or Cut-Off) from the drain to the source.

The remaining features of FIG. 8 are identical to those in FIG. 3, with like reference numerals denoting like features. The importance of capacitors 827 and 829 is shown in this circuit 800 as they are used to provide the high peak currents needed to switch the transistor 831.

Reference to a shunt regulator refers to any component or arrangement of components which can transition between an on and off when a reference voltage is applied. For instance, a circuit involving a comparator which compares an input voltage to a reference voltage and activates a transistor, in some preferred embodiments to bypass a diode is appropriate. Furthermore, the comparator can be omitted if the gate or base voltage of the transistor requires a suitable reference voltage. As another example, a field effect transistor including a body diode and an applicable gate voltage is appropriate.

Throughout the figures, the intermediate voltage output terminal is shown unconnected to ground. The intermediate voltage output terminal can be connected to ground when it is required that the intermediate voltage output is 0 V. When it is not required that the intermediate voltage output is 0 V, the terminal will not be connected to ground.

Above, the transistors are referred to as BJTs (bipolar junction transistors) and as such the terminology reflects this. However, in all cases, a FET (field effect transistor) can be used to replace each BJT. The references to "base" therefore encompass both the base of a BJT and the gate of a FET, the references to "collector" also encompass the drain of a FET, and the references to "emitter" also encompass the source of a FET.

The circuits shown and described can be implemented on a circuit board such as a PCB or within a semiconductor chip.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A three-output DC voltage supply for providing a positive, an intermediate, and a negative voltage supply comprising:
   a positive DC voltage bus and a negative DC voltage bus configured to be connected to a DC power source;
   a first voltage divider connected between the positive DC voltage bus and the negative DC voltage bus, wherein the first voltage divider includes a voltage-setting component and a resistive component; and
   a short-circuit protection component including first and second transistors of opposite types connected between the voltage-setting component and the resistive component, wherein
   a base of the first transistor is connected to a collector of the second transistor to define a first base/collector node,
   a base of the second transistor is connected to a collector of the first transistor to define a second base/collector node, and
   the intermediate voltage supply is provided by either the first or the second base/collector node.

2. The three-output DC voltage supply according to claim 1, wherein the first transistor is a PNP or P-channel transistor.

3. The three-output DC voltage supply according to claim 2, wherein the second transistor is an NPN or N-channel transistor.

4. The three-output DC voltage supply according to claim 3, wherein the intermediate voltage supply is provided by the first base/collector node.

5. The three-output DC voltage supply according to claim 3, wherein the intermediate voltage supply is provided by the second base/collector node.

6. The three-output DC voltage supply according to claim 1, further comprising a first capacitor connected between the positive voltage supply and the intermediate voltage supply, and a second capacitor connected between the intermediate voltage supply and the negative voltage supply.

7. The three-output DC voltage supply according to claim 1, wherein the voltage-setting component includes a Zener diode.

8. The three-output DC voltage supply according to claim 1, wherein the voltage-setting component includes a third transistor.

9. The three-output DC voltage supply according to claim 8, further comprising a pair of voltage-setting resistors connected between the positive DC voltage bus and the negative DC voltage bus to define a potential divider, and wherein a base of the third transistor is connected to an output of the first voltage divider.

10. The three-output DC voltage supply according to claim 1, wherein the voltage-setting component includes a shunt regulator.

11. The three-output DC voltage supply according to claim 10, further comprising a pair of voltage-setting resistors connected between either the positive DC voltage bus and an emitter of the first transistor or the negative DC voltage bus and an emitter of the second transistor to define a potential divider, and wherein an input of the shunt regulator is connected to an output of the voltage divider.

12. The three-output DC voltage supply according to claim 11, wherein the shunt regulator includes an adjustable reference diode.

13. The three-output DC voltage supply according to claim 1, wherein the resistive component includes a resistor.

14. The three-output DC voltage supply according to claim 1, wherein the first and the second transistors are connected by respective emitters of the first and the second transistors between the voltage-setting component and the resistive component.

15. The three-output DC voltage supply according to claim 1, wherein the DC power source is an output from a DC-DC converter.

16. The three-output DC voltage supply according to claim 1, wherein the DC power source is a rectified output from a transformer.

17. The three-output DC voltage power supply according to claim 1, wherein the intermediate voltage supply is a 0-V voltage supply.

* * * * *